United States Patent
Wang

(10) Patent No.: US 9,642,231 B2
(45) Date of Patent: May 2, 2017

(54) ESD PROTECTION FOR FINGERPRINT SENSOR

(71) Applicant: Egis Technology Inc., Taipei (TW)

(72) Inventor: Cheng-Chung Wang, Taipei (TW)

(73) Assignee: Egis Technology Inc., Taipei (TW)

( * ) Notice: Subject to any disclaimer, the term of this patent is extended or adjusted under 35 U.S.C. 154(b) by 30 days.

(21) Appl. No.: 14/956,285

(22) Filed: Dec. 1, 2015

(65) Prior Publication Data

US 2016/0381775 A1    Dec. 29, 2016

(30) Foreign Application Priority Data

Jun. 24, 2015   (CN) .......................... 2015 1 0351738

(51) Int. Cl.
| | |
|---|---|
| G06K 9/00 | (2006.01) |
| H05F 3/02 | (2006.01) |
| H05K 1/02 | (2006.01) |
| H05K 1/11 | (2006.01) |

(52) U.S. Cl.
CPC ........... *H05F 3/02* (2013.01); *G06K 9/00053* (2013.01); *H05K 1/0254* (2013.01); *H05K 1/115* (2013.01); *H05K 2201/1031* (2013.01); *H05K 2201/10151* (2013.01)

(58) Field of Classification Search
CPC .... G06K 9/00053; H05F 3/02; H05K 1/0254; H05K 1/115; H05K 2201/10151; H05K 2201/1031

USPC .......................................................... 382/124
See application file for complete search history.

(56) References Cited

U.S. PATENT DOCUMENTS

| | | | | |
|---|---|---|---|---|
| 6,326,227 | B1* | 12/2001 | Thomas ............. | G06K 9/00053 438/48 |
| 6,346,739 | B1* | 2/2002 | Lepert ................ | G06K 9/00053 257/532 |
| 2014/0219523 | A1 | 8/2014 | Perezselsky et al. | |

FOREIGN PATENT DOCUMENTS

TW            I250465        3/2006

\* cited by examiner

*Primary Examiner* — Manuchehr Rahmjoo

(57) ABSTRACT

A fingerprint sensor is provided. The fingerprint sensor includes a sensing array sensing fingerprint information of a user, an insulating surface disposed on the sensing array, and a printed circuit board (PCB) disposed under the sensing array. The PCB includes a substrate, a ground plane disposed on the second surface of the substrate, and an electrostatic discharge (ESD) ring disposed on the first surface of the substrate and surrounding the sensing array. The substrate includes a first surface and a second surface opposite the first surface. The ESD ring surrounds the sensing array. When an ESD event occurs, ESD energy is discharged from the ESD ring to the ground plane through a plurality of vias in the substrate without passing the sensing array.

18 Claims, 5 Drawing Sheets

ESD PROTECTION FOR FINGERPRINT SENSOR

CROSS REFERENCE TO RELATED APPLICATIONS

This application claims priority of China Patent Application No. 201510351738.7, filed on Jun. 24, 2015, the entirety of which is incorporated by reference herein.

BACKGROUND OF THE INVENTION

Field of the Invention

The invention relates to a fingerprint sensor, and more particularly to a fingerprint sensor that is protected from electrostatic discharge (ESD).

Description of the Related Art

In recent years, biological identification technology has become increasingly mature, and different biological features can be used for identifying users. Since the recognition rate and accuracy of fingerprint identification technology are better than those of other biological feature identification technologies, fingerprint identification and verification are used extensively in various areas.

Fingerprint identification and verification technology detects a user's fingerprint pattern, captures fingerprint data from the fingerprint pattern, and saves the fingerprint data as a template. Thereafter, the user presses or slides a finger on or over the fingerprint sensor so that a fingerprint is captured and compared with the template. If the two match, then the user's identity is confirmed.

With the continued miniaturization of the integrated circuits (ICs) used in fingerprint sensors, these integrated circuits have become more susceptible to damage caused by electrostatic discharge (ESD). ESD is a phenomenon that occurs when excess charges are transmitted from the I/O pins to the integrated circuit too quickly, damaging the internal circuit.

Therefore, it is desired to dispose ESD protection circuits into a fingerprint sensor to protect the devices and circuitry of the integrated circuit against ESD damage.

BRIEF SUMMARY OF THE INVENTION

Fingerprint sensors are provided. An embodiment of a fingerprint sensor is provided. The fingerprint sensor comprises a sensing array sensing fingerprint information of a user, an insulating surface disposed on the sensing array, and a printed circuit board (PCB) disposed under the sensing array. The PCB comprises a substrate, a ground plane disposed on the second surface of the substrate, and an electrostatic discharge (ESD) ring disposed on the first surface of the substrate and surrounding the sensing array. The substrate comprises a first surface and a second surface opposite the first surface. The ESD ring surrounds the sensing array. When an ESD event occurs, ESD energy is discharged from the ESD ring to the ground plane through a plurality of vias in the substrate without passing the sensing array.

Furthermore, another embodiment of a fingerprint sensor is provided. The fingerprint sensor comprises a sensing array sensing fingerprint information of a user, an insulating surface disposed on the sensing array, and a printed circuit board (PCB) disposed under the sensing array. The PCB has a specific shape, and comprises a substrate comprising a first surface and a second surface opposite the first surface, a plurality of vias, a ground plane disposed on the second surface of the substrate, and a plurality of first metal stubs disposed on the first surface of the substrate. Each of the first metal stubs has a first terminal coupled to the ground plane through one of the vias, and a second terminal extending to an edge of the first surface. When an ESD event occurs, ESD energy is discharged from the second terminal of the first metal stub to the ground plane through the corresponding via without passing the sensing array.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
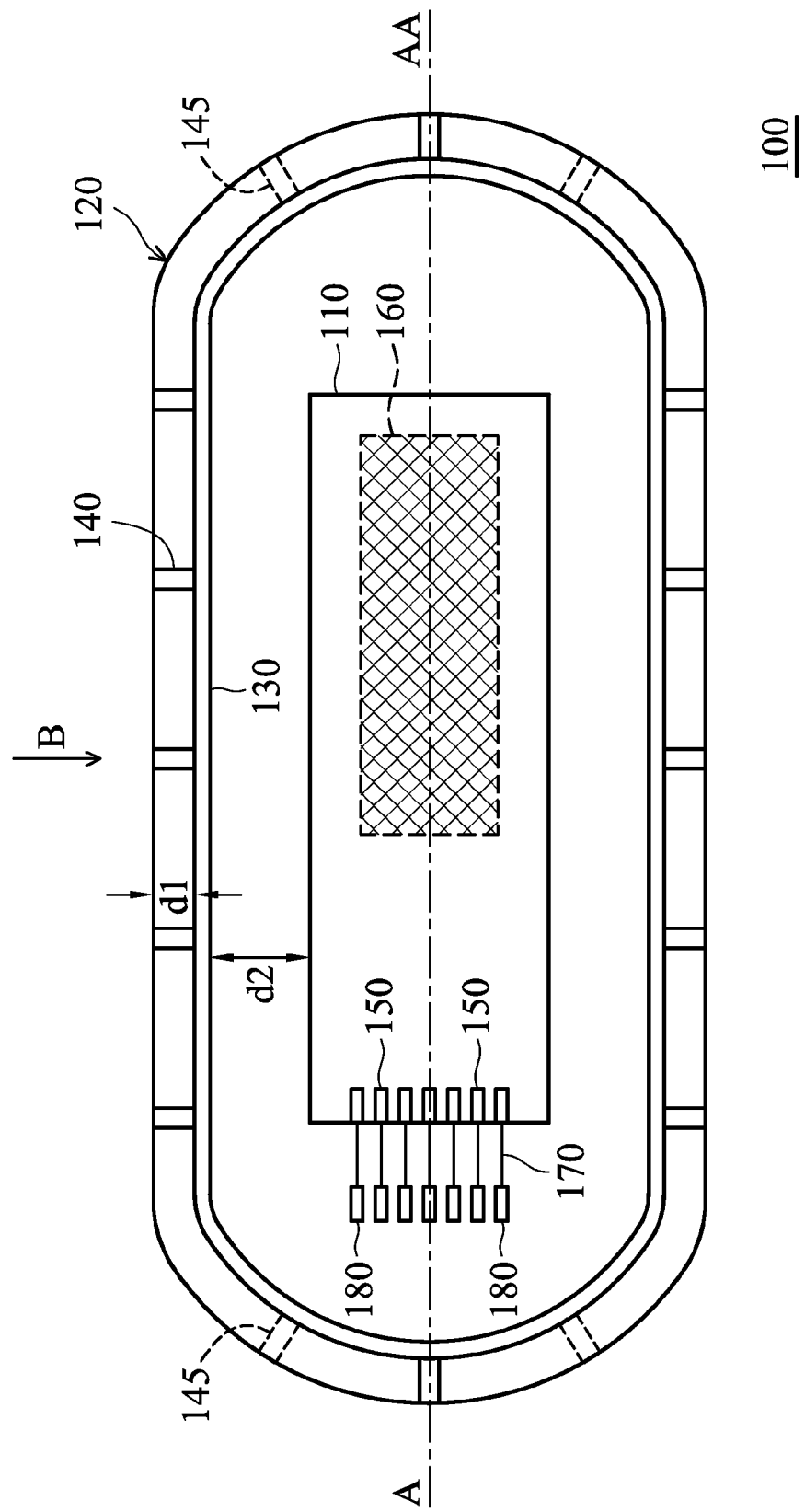
FIG. 1 shows a top view of a fingerprint sensor according to an embodiment of the invention.

FIG. 1 shows a top view of a fingerprint sensor 100 according to an embodiment of the invention. In FIG. 1, a molding compound of the fingerprint sensor 100 is removed to simplify the description, wherein the molding compound of the fingerprint sensor 100 will described in FIG. 2 and FIG. 3. Referring to FIG. 1, the fingerprint sensor 100 comprises a sensing die 110, a printed circuit board (PCB) 120, an electrostatic discharge (ESD) ring 130, and a plurality of metal stubs 140 and 145. In general, the sensing die 110 comprises a sensing array, a readout module, a processor and so on. In the sensing die 110, after obtaining a sensing output of the sensing array, the processor determines whether the user's finger is in contact with an insulating surface disposed on the sensing array, and further obtains fingerprint information of the finger, so as to determine that the sensing output corresponds to a fingerprint ridge or a fingerprint valley of the finger. Next, the fingerprint sensor 100 provides the fingerprint information of the finger to other devices or circuits for subsequent processes, for example, a fingerprint identification operation is performed by a fingerprint identification algorithm. In FIG. 1, the PCB 120 is a double-layer PCB. In other embodiments, the PCB 120 is a multi-layer PCB. In order to simplify the description, the other surface mount devices (SMDs) on the PCB 120 will not be described further.

Figure 2:
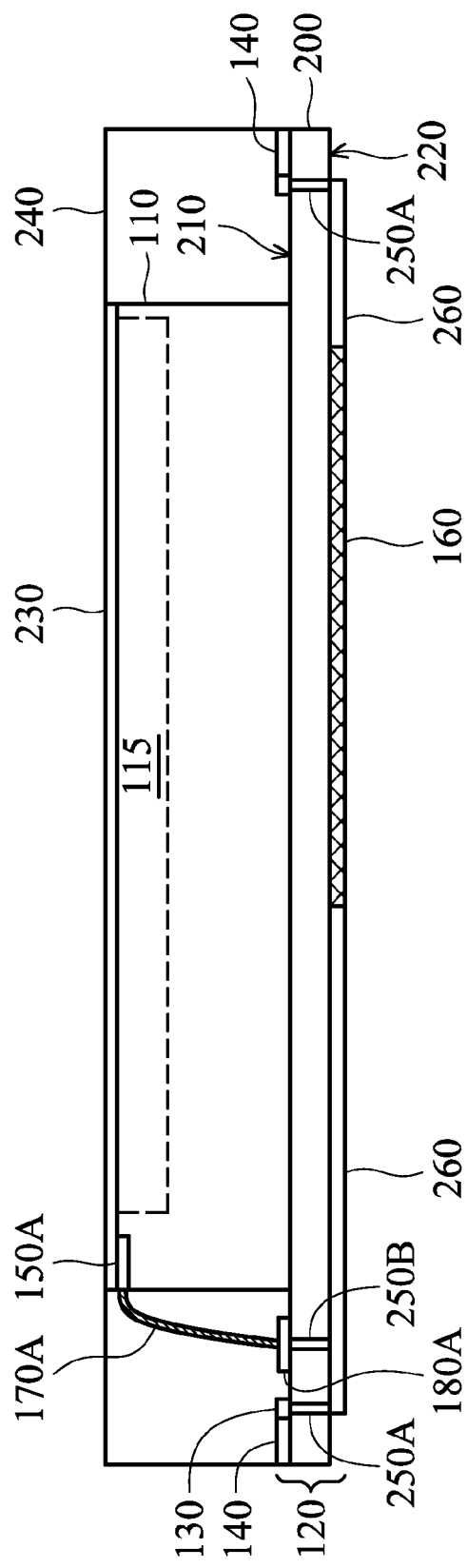
FIG. 2 shows a sectional diagram along a section line A-AA of the fingerprint sensor of FIG. 1.

FIG. 2 shows a sectional diagram along a section line A-AA of the fingerprint sensor 100 of FIG. 1. Referring to FIGS. 1 and 2 together, a pin 150 of the sensing die 110 is mounted at a pad 180 of the PCB 120 via a bonding wire 170. The sensing array is implemented in the sensing die, i.e. the sensing die 110 comprising a sensing array 115, wherein the sensing array 115 is formed by a plurality of sensing units arranged in a two-dimensional manner. Furthermore, an insulating surface 230 overlays the sensing array 115. The PCB 120 comprises a substrate 200, a ESD ring 130, a plurality of metal stubs 140, and a ground plane 160. The substrate 200 is a core insulator, which has a first surface 210 and a second surface 220, wherein the second surface 220 is disposed opposite the first surface 210. The ESD ring 130 is disposed on the first surface 210 of the substrate 200, and the ESD ring 130 is surrounding the sensing array 110. In the embodiment, the PCB 120 has a specific shape. For example, the PCB 120 of the FIG. 1 is shaped like a capsule. Moreover, the ESD ring 130 is a loop formed by a metal trace. In the embodiment, the ESD ring 130 has a specific shape similar to the PCB 120. The metal stubs 140 are disposed on the first surface 210 of the substrate 200, and the metal stubs 140 are directly coupled to the ESD ring 130. In the embodiment, a terminal of each metal stub 140 is coupled to the ESD ring 130, and another terminal of each metal stub 140 is extending to an edge of the first surface 210. It should be noted that the ESD ring 130 is disposed near the outer edge of the PCB 120. For example, on the first surface 210 of the substrate 200, a distance d1 between the ESD ring 130 and the outer edge of the PCB 120 (i.e. a length of the metal stub 140) is shorter than a distance d2 between the ESD ring 130 and the sensing die 110. Furthermore, the ESD ring 130 is coupled to the ground plane 160 on the second surface 220 of the substrate 200 through a plurality of vias 250A disposed in the substrate 200, and the metal traces 260 disposed on the second surface 220 of the substrate 200. In one embodiment, the ground plane 160 is a ground layer of a multi-layer PCB. Moreover, a ground pin 150A of the sensing die 110 is coupled to the ground plane 160 of the second surface 220 through the bonding wire 170A, a pad 180A, a via 250B disposed in the substrate 20, and the metal trace 260. In addition, in FIG. 2, the fingerprint sensor 100 further comprises a molding compound 240, such as Epoxy molding compound (EMC), which is formed on the first surface 210 of the substrate 200 through a molding process, and the molding compound 240 covers the metal stubs 140 and the ESD ring 130. It should be noted that the molding compound 240 surrounds the sensing die 110, and the molding compound 240 has an opening so that the insulating surface 230 is exposed. Thus, after completing the package of the fingerprint sensor 100, the user's fingers can come into contact with the insulating surface 230 for sensing. Furthermore, the metal stubs 145 are disposed on the second surface 220 of the substrate 200. A terminal of each metal stub 145 is coupled to the ESD ring 130 through the via 250A of the substrate 200, and the terminal of each metal stub 145 is further coupled to the ground plane 160 via the metal trace 260. In addition, another terminal of each metal stub 145 extends to an edge of the second surface 220. To simplify the description, configuration of the solder resist (SR) of the PCB 120 will not be described further.

Figure 3:
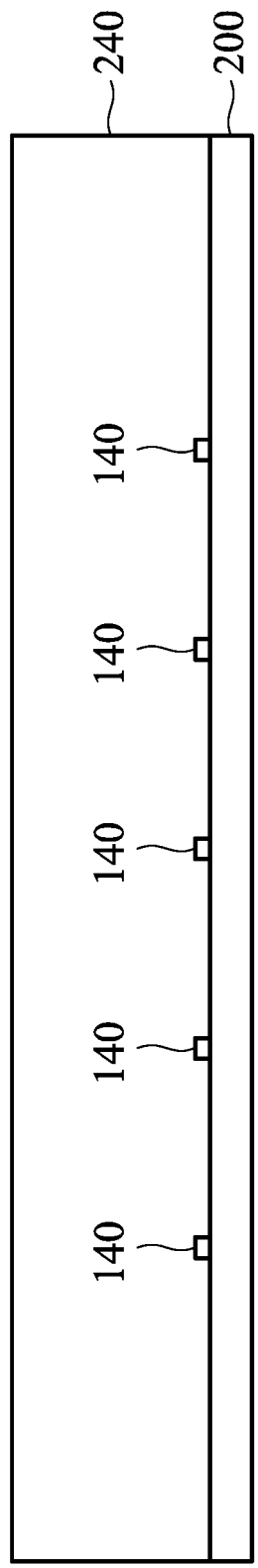
FIG. 3 shows a lateral view of the fingerprint sensor of FIG. 1.

During a package procedure, a cutting process is traditionally performed on each fingerprint sensor after completion of a molding process, to obtain the packaged products. FIG. 3 shows a lateral view of the fingerprint sensor 100 of FIG. 1 (along the direction of arrow B). After completing the package of the fingerprint sensor 100, the metal stubs 140 and 145 of the PCB 120 form a plurality of exposed discharge points on the side of the fingerprint sensor 100. Furthermore, due to small line spacing and small line width of the metal stubs 140 and 145, it is easy to perform a cutting process on the PCB 120. Referring to FIG. 2 and FIG. 3 together, the discharge points formed by the metal stubs 140 are disposed between the molding compound 240 and the substrate 200. Therefore, when an ESD event occurs, ESD energy from the air is speedily transmitted to the ESD ring 130 through the discharge points formed by the metal stubs 140, and the ESD energy is discharged to the ground plane 160 through the vias 250A of the substrate 200 and the metal traces 260 in sequence. Thus, the ESD energy can be transmitted to a ground through the discharge paths formed by the ESD ring 130, wherein the discharge paths do not pass through the sensing die 110. Therefore, the ESD energy will not damage the sensing die 110. Furthermore, compared with a conventional fingerprint sensor having an ESD ring (e.g. a conductive strip) disposed between an insulating surface and a molding compound, the manufacturing cost is decreased by disposing an ESD ring on the PCB.

Figure 4:
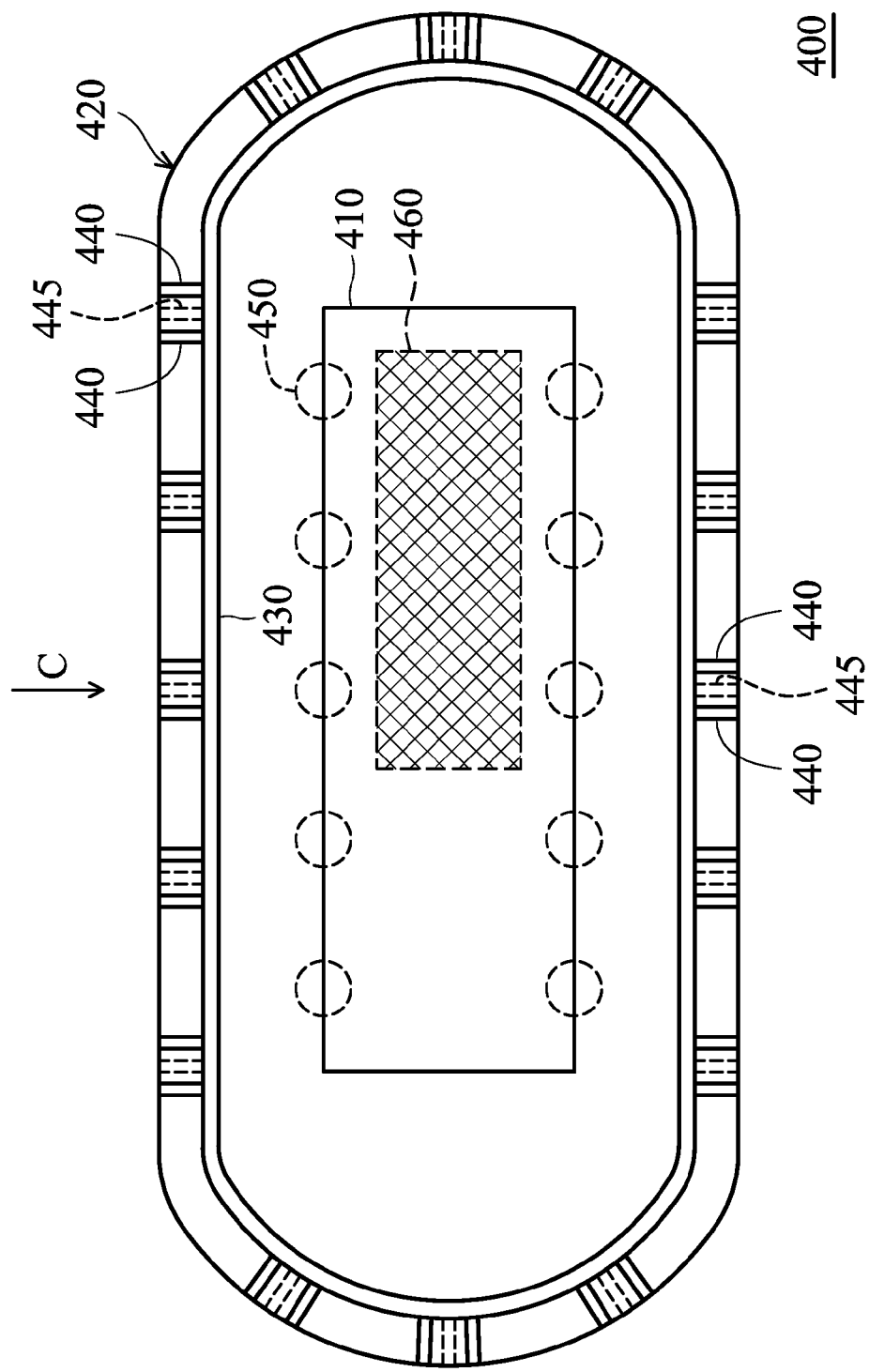
FIG. 4 shows a top view of a fingerprint sensor according to another embodiment of the invention.

FIG. 4 shows a top view of a fingerprint sensor 400 according to another embodiment of the invention. In FIG. 4, a molding compound of the fingerprint sensor 400 is removed to simplify the description. Referring to FIG. 4, the fingerprint sensor 400 comprises a sensing die 410, a PCB 420, an ESD ring 430, and a plurality of metal stubs 440 and 445. As described above, in the sensing die 410, after obtaining the sensing output of the sensing array, the processor determines whether the user's finger is in contact with an insulating surface disposed on the sensing array, and further obtains fingerprint information of the finger, so as to determine that the sensing output corresponds to a fingerprint ridge or a fingerprint valley of the finger. Next, the fingerprint sensor 400 provides the fingerprint information of the finger to other devices or circuits for subsequent processes, for example, a fingerprint identification operation is performed by a fingerprint identification algorithm. In the embodiment, the metal stubs 440 and the ESD ring 430 are disposed in a top layer of the PCB 420, and the metal stubs 445 are disposed in a bottom layer of the PCB 420. In other embodiments, the PCB 420 is a multi-layer PCB, and the metal stubs 445 are disposed in any layer of the PCB 420 under the top layer. In FIG. 4, a quantity of discharge paths is increased by increasing a quantity of the metal stubs, thereby enhancing ESD protection for the fingerprint sensor 400. It should be noted that the metal stubs 440 and the metal stubs 445 are disposed in different layers of the PCB 420, and the metal stubs 440 do not overlap the metal stubs 445.

Figure 5:
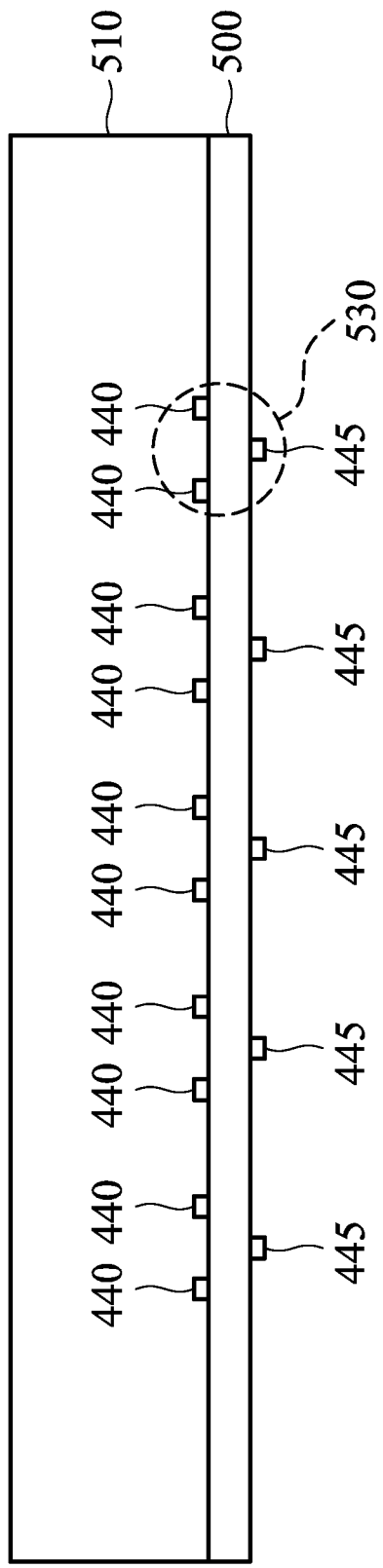
FIG. 5 shows a lateral view of the fingerprint sensor of FIG. 4.

FIG. 5 shows a lateral view of the fingerprint sensor 400 of FIG. 4 (along the direction of arrow C). After completing the package of the fingerprint sensor 400, the metal stubs 440 and 445 of the PCB 420 form a plurality of exposed discharge points on the side of the fingerprint sensor 400. Furthermore, due to the small line spacing and small line width of the metal stubs 440 and 445, it is easy to perform a cutting process on the PCB 420. In FIG. 5, the discharge points formed by the metal stubs 440 are disposed between the molding compound 510 and the substrate 500, and the discharge points formed by the metal stubs 445 are disposed under the substrate 500. Therefore, the neighboring discharge points can provide more discharge paths, as shown in label 530. Furthermore, the metal stubs 440 do not overlap the metal stubs 445. Referring to FIG. 4 and FIG. 5 together, when an ESD event occurs, ESD energy from the air is speedily transmitted to the ESD ring 430 through the discharge points formed by the metal stubs 440, and the ESD energy is discharged to the ground plane 460 through the vias in the substrate 500 and the metal traces in sequence. Moreover, the ESD energy is also directly discharged to the ground plane 460 through the discharge points formed by the metal stubs 445 adjacent to the metal stubs 440 and the corresponding metal traces. Thus, the ESD energy can be transmitted to the ground through different discharge paths, wherein the discharge paths formed by the metal stubs 440 and the discharge paths formed by the metal stubs 445 do not pass through the sensing die 410. Therefore, the ESD energy will not damage the sensing die 410.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fingerprint sensor, comprising:
    a sensing array, sensing fingerprint information of a user;
    an insulating surface disposed on the sensing array; and
    a printed circuit board (PCB) disposed under the sensing array, comprising:
        a substrate, comprising a first surface and a second surface opposite the first surface;
        a ground plane disposed on the second surface of the substrate; and
        an electrostatic discharge (ESD) ring disposed on the first surface of the substrate and surrounding the sensing array,
    wherein when an ESD event occurs, ESD energy is discharged from the ESD ring to the ground plane through a plurality of vias in the substrate without passing the sensing array.

2. The fingerprint sensor as claimed in claim 1, wherein the PCB further comprises:
    a plurality of first metal stubs disposed on the first surface of the substrate,
    wherein each of the first metal stubs has a first terminal directly coupled to the ESD ring, and a second terminal extending to an edge of the first surface.

3. The fingerprint sensor as claimed in claim 2, further comprising:
    a molding compound disposed on the first surface of the substrate, and covering the first metal stubs and the ESD ring.

4. The fingerprint sensor as claimed in claim 3, wherein the molding compound surrounds the sensing array and the insulating surface, and the molding compound has an opening so that the insulating surface is exposed.

5. The fingerprint sensor as claimed in claim 2, wherein the sensing array is disposed in a sensing die, and the sensing die is implemented on the PCB, wherein a distance between the second terminal of the first metal stub and the ESD ring is shorter than a distance between the ESD ring and the sensing die on the first surface of the substrate.

6. The fingerprint sensor as claimed in claim 3, wherein the second terminal of each of the first metal stubs forms a first discharge point on one side surface of the PCB, and when the ESD event occurs, the ESD energy is discharged from the first discharge point to the ground plane through the first metal stub, the ESD ring, and the vias in the substrate in sequence.

7. The fingerprint sensor as claimed in claim 6, wherein the PCB further comprises:
    a plurality of second metal stubs disposed on the second surface of the substrate,
    wherein each of the second metal stubs has a third terminal coupled to the ground plane, and a fourth terminal extending to an edge of the second surface.

8. The fingerprint sensor as claimed in claim 7, wherein the fourth terminal of each of the second metal stubs forms a second discharge point on the side surface of the PCB, and when the ESD event occurs, the ESD energy is further discharged from the second discharge point to the ground plane via the second metal stub.

9. The fingerprint sensor as claimed in claim 8, wherein the first metal stubs do not overlap the second metal stubs, and at least one of the first discharge points of the first metal stubs is adjacent to the second discharge point of the second metal stub on the side surface of the PCB.

10. A fingerprint sensor, comprising:
    a sensing array, sensing fingerprint information of a user;
    an insulating surface disposed on the sensing array; and
    a printed circuit board (PCB) disposed under the sensing array, having a specific shape, and comprising:
        a substrate, comprising a first surface and a second surface opposite the first surface;
        a plurality of vias;
        a ground plane disposed on the second surface of the substrate; and
        a plurality of first metal stubs disposed on the first surface of the substrate,
        wherein each of the first metal stubs has a first terminal coupled to the ground plane through one of the vias, and a second terminal extending to an edge of the first surface,
    wherein when an ESD event occurs, ESD energy is discharged from the second terminal of the first metal stub to the ground plane through the corresponding via without passing the sensing array.

11. The fingerprint sensor as claimed in claim 10, wherein the PCB further comprises:
    a metal trace disposed on the first surface of the substrate, wherein the metal trace forms a loop having the shape of the PCB to surround the sensing array,
    wherein the first terminal of each of the first metal stubs is directly coupled to the metal trace, and the metal trace is coupled to the ground plane through the vias in the substrate.

12. The fingerprint sensor as claimed in claim 11, further comprising:
    a molding compound disposed on the first surface of the substrate, and covering the first metal stubs and the metal trace.

13. The fingerprint sensor as claimed in claim 12, wherein the molding compound surrounds the sensing array and the insulating surface, and the molding compound has an opening so that the insulating surface is exposed.

14. The fingerprint sensor as claimed in claim 11, wherein the second terminal of each of the first metal stubs forms a first discharge point on one side surface of the PCB, and when the ESD event occurs, the ESD energy is discharged from the first discharge point to the ground plane through the first metal stub, the metal trace, and the vias in the substrate in sequence.

15. The fingerprint sensor as claimed in claim 14, wherein the PCB further comprises:
    a plurality of second metal stubs disposed on the second surface of the substrate,
    wherein each of the second metal stubs has a third terminal coupled to the ground plane, and a fourth terminal extending to an edge of the second surface.

16. The fingerprint sensor as claimed in claim 15, wherein the fourth terminal of each of the second metal stubs forms a second discharge point on the side surface of the PCB, and when the ESD event occurs, the ESD energy is further discharged from the second discharge point to the ground plane via the second metal stub.

17. The fingerprint sensor as claimed in claim 16, wherein the first metal stubs do not overlap the second metal stubs, and at least one of the first discharge points of the first metal stubs is adjacent to the second discharge point of the second metal stub on the side surface of the PCB.

18. The fingerprint sensor as claimed in claim 15, wherein the sensing array is disposed in a sensing die, and the sensing die is implemented on the PCB, wherein a distance between the second terminal of the first metal stub and the metal trace is shorter than a distance between the metal trace and the sensing die on the first surface of the substrate.

* * * * *